United States Patent
Ikeda et al.

(10) Patent No.: US 9,585,269 B2
(45) Date of Patent: Feb. 28, 2017

(54) ELECTRICAL CONNECTION BOX

(71) Applicant: YAZAKI CORPORATION, Tokyo (JP)

(72) Inventors: Tomohiro Ikeda, Kakegawa (JP); Kouji Koizumi, Kakegawa (JP); Hirokuni Koike, Kakegawa (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 14/605,426

(22) Filed: Jan. 26, 2015

(65) Prior Publication Data

US 2015/0129299 A1    May 14, 2015

Related U.S. Application Data

(63) Continuation of application No. PCT/JP2013/070142, filed on Jul. 25, 2013.

(30) Foreign Application Priority Data

Jul. 27, 2012   (JP) ................. 2012-166820

(51) Int. Cl.
*H05K 5/02*        (2006.01)
*B60R 16/023*   (2006.01)
(Continued)

(52) U.S. Cl.
CPC ......... *H05K 5/0247* (2013.01); *B60R 16/0238* (2013.01); *B60R 16/0239* (2013.01);
(Continued)

(58) Field of Classification Search
CPC .................................................. H05K 5/0247
(Continued)

(56) References Cited

U.S. PATENT DOCUMENTS

| | | | |
|---|---|---|---|
| 6,348,662 B1* | 2/2002 | Kobayashi | H01R 9/2466 174/261 |
| 2002/0003377 A1* | 1/2002 | Yuasa | H01R 9/226 307/10.1 |

(Continued)

FOREIGN PATENT DOCUMENTS

| | | |
|---|---|---|
| EP | 2 416 483 A2 | 2/2012 |
| JP | 61129418 U | 8/1986 |

(Continued)

OTHER PUBLICATIONS

International Search Report of PCT/JP2013/070142, dated Sep. 24, 2013. [PCT/ISA/210].

(Continued)

*Primary Examiner* — Hoa C Nguyen
*Assistant Examiner* — Stanley Tso
(74) *Attorney, Agent, or Firm* — Sughrue Mion, PLLC

(57) ABSTRACT

An object of the present invention is to provide an electrical connection box in which reduction in weight can be achieved by simplification of the construction, while preventing short-circuiting of a positive electrode side busbar and a negative electrode side busbar. An electrical connection box includes: a positive electrode side busbar connected to a positive electrode of a battery; a negative electrode side busbar connected to a negative electrode of the battery; and a case in which the positive electrode side busbar and the negative electrode side busbar are accommodated. The case includes: a bottom wall; a circumferential wall erected from the bottom wall; and a partition wall erected from the bottom wall. The partition wall is a waterproof partition that partitions a positive electrode side busbar accommodating area and a negative electrode side busbar accommodating area.

2 Claims, 3 Drawing Sheets

(51) Int. Cl.
*H01M 2/20* (2006.01)
*H05K 7/02* (2006.01)
*H02G 3/16* (2006.01)
*H01M 10/42* (2006.01)

(52) U.S. Cl.
CPC .............. *H01M 2/206* (2013.01); *H05K 5/02* (2013.01); *H05K 7/026* (2013.01); *H01M 10/425* (2013.01); *H02G 3/16* (2013.01)

(58) Field of Classification Search
USPC ........................................................ 174/535
See application file for complete search history.

(56) References Cited

U.S. PATENT DOCUMENTS

| | | | | |
|---|---|---|---|---|
| 2002/0028591 | A1* | 3/2002 | Yuasa | H01R 9/2458 439/76.2 |
| 2002/0137368 | A1* | 9/2002 | Sumida | B60R 16/0239 439/76.2 |
| 2002/0180272 | A1 | 12/2002 | Yuasa et al. | |
| 2003/0211764 | A1* | 11/2003 | Fukamachi | H01R 13/6315 439/157 |
| 2007/0218721 | A1* | 9/2007 | Naritomi | H02G 3/088 439/131 |
| 2011/0240601 | A1* | 10/2011 | Hashizume | H01L 21/02063 216/83 |
| 2013/0319715 | A1* | 12/2013 | Korcz | H02G 3/14 174/50 |

FOREIGN PATENT DOCUMENTS

| | | |
|---|---|---|
| JP | 1-166417 U | 11/1989 |
| JP | 5-48527 U | 6/1993 |
| JP | 5-70123 U | 9/1993 |
| JP | 2001-102768 A | 4/2001 |
| JP | 2002-34121 A | 1/2002 |
| JP | 2004-120907 A | 4/2004 |
| JP | 2007282321 A | 10/2007 |
| KR | 1020110000364 A | 1/2011 |

OTHER PUBLICATIONS

Communication dated Jul. 5, 2016, from the State Intellectual Property of People's Republic of China in counterpart application No. 201380050896.8.
Communication dated Nov. 10, 2015 from the Japanese Patent Office in counterpart application No. 2012-166820.
Communication dated Feb. 23, 2016 from the European Patent Office in counterpart application No. 13822860.6.
Communication dated Jan. 19, 2016, from the Japanese Patent Office in counterpart application No. 2012-166820.
Communication dated Nov. 23, 2016 from the European Patent Office in counterpart application No. 13822860.6.

* cited by examiner

ELECTRICAL CONNECTION BOX

TECHNICAL FIELD

The present invention relates to an electrical connection box that includes a positive electrode side busbar connected to a positive electrode of a battery, a negative electrode side busbar connected to a negative electrode of the battery, and a case in which the positive electrode side busbar and the negative electrode side busbar are accommodated.

BACKGROUND ART

Various electronic devices are mounted on a vehicle. In order to perform power supply and signal transmission to various electronic devices, the vehicle is provided with a plurality of wire harnesses in which a plurality of electrical wires is bundled. Also, in the vehicle, an electrical connection box used for mutual connection of wire harnesses is disposed at an appropriate position.

As an example of the electrical connection box, an electrical connection box disclosed in Patent Literature 1 will be described.

As illustrated in FIGS. 3 and 4, the conventional electrical connection box disclosed in Patent Literature 1 includes an upper case 101 and a lower case 102 made of a synthetic resin, and a plurality of wiring boards a, b, c, and d that is stacked and accommodated in the upper case 101 and the lower case 102. Of the plurality of wiring boards a, b, c, and d, the lowermost wiring board d (wiring board of the lower case 102 side) is configured as a double-sided wiring board in which busbars 104 are disposed on both sides (see FIG. 4).

Each of the wiring boards a, b, c, and d is configured to include an insulating substrate 103, and a busbar 104 having a desired pattern on the insulating substrate 103. In the busbar 104, connection terminals 105 for input and output are erected upward or downward. In the insulating substrate 103, terminal insertion holes 106 are drilled such that connection terminals 105 of the adjacent wiring boards a, b, c, and d are inserted.

In a mounting surface on which the busbars 104 of the respective insulating substrates 103 are mounted, a busbar accommodation groove 115 is provided by protruding ribs 114 at both sides of the busbar 104 according to a desired pattern. In the inner surface of the lower case 102, a water crosslinking prevention rib 117 protrudes on both sides of the busbar 104A for a ground circuit along a desired pattern disposed in a rear surface of the lowermost wiring board d (surface of the lower case 102 side). The crosslinking prevention rib 117 is formed according to the shape of the busbar 104A for the ground circuit and is formed to match with the rib 114 formed in the rear surface of the lowermost wiring board d. Also, both ends of the ribs 114 provided on both sides of the busbar 104A for the ground circuit are closed by a sealing portion (not illustrated) provided corresponding to the connection terminal 105 of the busbar 104A for the ground circuit. In the electrical connection box of the related art, the busbar 104A for the ground circuit in the lowermost wiring board d is surrounded in a sealed state by the rib 114 of the bottom surface of the insulating substrate 103, the water crosslinking prevention rib 117 of the inner surface of the lower case 102, and the sealing portion (not illustrated). Thus, the busbar 104A for the ground circuit is isolated from the other busbars 104. Therefore, there has been proposed a structure for isolating the busbar 104A (specific busbar) for the ground circuit and the other busbars 104.

CITATION LIST

Patent Literature

Patent Literature 1: JP 5-70123 A

SUMMARY OF INVENTION

Technical Problem

However, in the above-described electrical connection box of the related art, the water crosslinking prevention rib 117 is formed according to the shape of the busbar 104A, and therefore, if the number of busbars 104A increases, the shape of the crosslinking prevention rib 117 may become complicated and the weight thereof may increase.

An object of the invention is to provide an electrical connection box in which reduction in weight can be achieved by simplification of construction, while preventing short-circuiting of a positive electrode side busbar and a negative electrode side busbar.

Solution to Problem

In order to achieve the above object, the invention of one aspect is an electrical connection box includes: a positive electrode side busbar connected to a positive electrode of a battery; a negative electrode side busbar connected to a negative electrode of the battery; and a case in which the positive electrode side busbar and the negative electrode side busbar are accommodated, wherein the case includes a bottom wall, a circumferential wall erected from the bottom wall, and a partition wall erected from the bottom wall, and the partition wall is a waterproof partition wall that partitions the positive electrode side busbar accommodation area in which the positive electrode side busbar is accommodated and the negative electrode side busbar accommodation area in which the negative electrode side busbar is accommodated.

According to the invention, in the invention according to the one aspect, an upper end of the partition wall is positioned above an upper end of the circumferential wall.

According to the invention, in the invention according to the one aspect, the circumferential wall is provided with a pair of wall portions facing each other, and the partition wall is provided between the pair of wall portions.

Advantageous Effects of Invention

According to the invention of the one aspect, the case includes the bottom wall, the circumferential wall erected from the bottom wall, and the partition wall erected from the bottom wall. The partition wall is separately provided with the positive electrode side busbar accommodation area accommodating the positive electrode side busbar, and the negative electrode side busbar accommodation area accommodating the negative electrode side busbar. The partition wall is the waterproof partition wall that partitions the positive electrode side busbar accommodation area and the negative electrode side busbar accommodation area. Therefore, water is not penetrated over the positive electrode side busbar accommodation area and the negative electrode side busbar accommodation area. It is possible to prevent short-circuiting of the positive electrode side busbar accommodated in the positive electrode side busbar accommodation area and the negative electrode side busbar accommodated in the negative electrode side busbar accommodation area. Since the waterproof partition wall is provided, it is unnecessary to form the crosslinking prevention rib according to the shape of the busbar, as opposed to the related art. The shape of the case can be simplified, and the reduction in the weight of the case can be achieved.

According to the invention, the upper end of the partition wall is positioned above the upper end of the circumferential wall. For example, even when water is penetrated into the positive electrode side busbar accommodation area and the water level exceeds the upper end of the circumferential wall, the water is discharged from the circumferential wall. Therefore, it is possible to reliably prevent water from being penetrated over the partition wall into the positive electrode side busbar accommodation area and the negative electrode side busbar accommodation area.

According to the invention, the partition wall is provided such that the entire case is largely divided into two parts. Therefore, it is possible to widely provide the spaces for the positive electrode side busbar accommodation area and the negative electrode side busbar accommodation area. Also, when water is penetrated into the positive electrode side busbar accommodation area and the negative electrode side busbar accommodation area, it is possible to specify the discharge direction of water.

DESCRIPTION OF EMBODIMENTS

Figure 1:
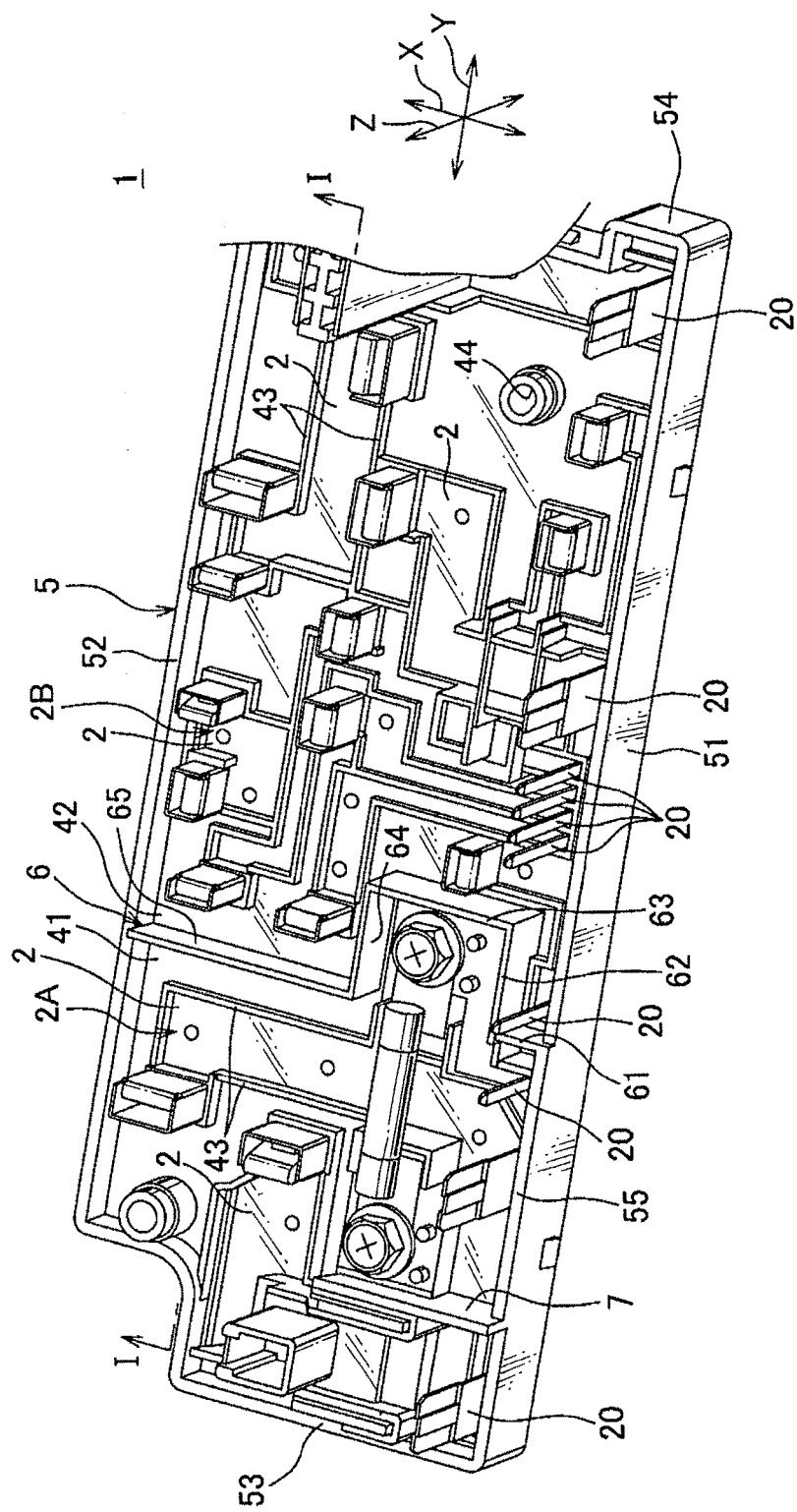
FIG. 1 illustrates a perspective view of an electrical connection box according to an embodiment of the present invention.
Figure 2:
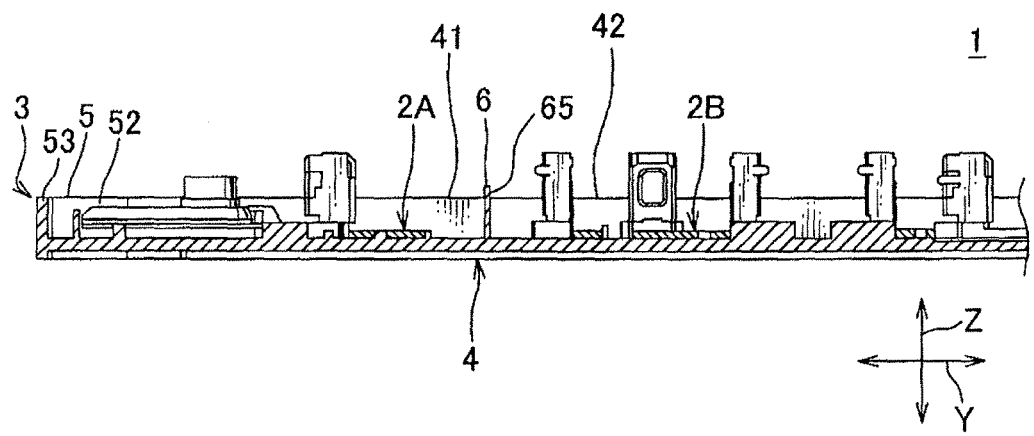
FIG. 2 illustrates a cross-sectional view taken along line I-I of FIG. 1.
Figure 3:
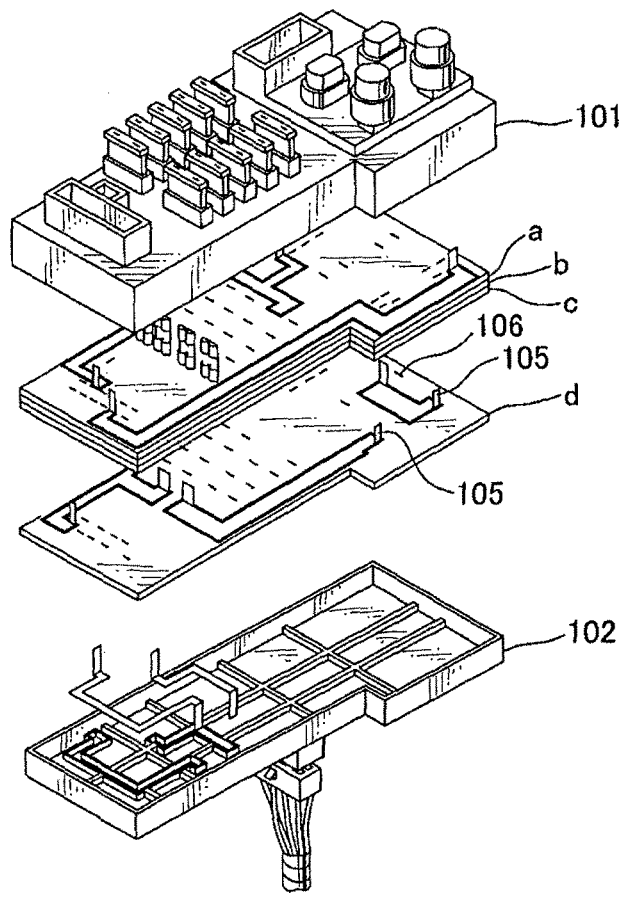
FIG. 3 illustrates an exploded perspective view of an electrical connection box of the related art.
Figure 4:
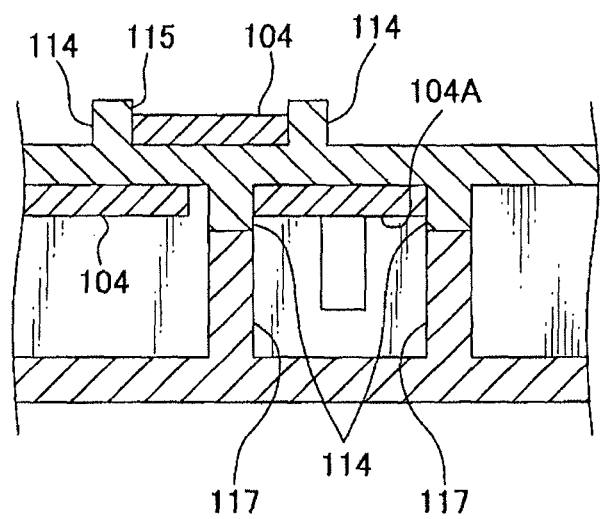
FIG. 4 illustrates a cross-sectional view of an assembled state of the electrical connection box of the related art illustrated in FIG. 3.

Hereinafter, an embodiment of an electrical connection box according to the present invention will be described with reference to FIGS. 1 and 2. The electrical connection box 1 of the present invention illustrated in FIGS. 1 and 2 is mounted on a vehicle to supply power to and transmit a signal to electronic devices mounted on the vehicle. Also, in the present invention, a junction block (also called "junction box"), a fuse block (also called "fuse box"), and a relay block (also called "relay box") are collectively referred to as an electrical connection box.

The electrical connection box 1 is configured to include a positive electrode side busbar group 2A (positive electrode side busbar) connected to a positive electrode of a battery, a negative electrode side busbar group 2B (negative electrode side busbar) connected to a negative electrode of the battery, and a lower case 3 (case) in which the positive electrode side busbar group 2A, the negative electrode side busbar group 2B, a plurality of electrical parts (not illustrated) connected to the busbar groups 2A and 2B are accommodated, and an upper case (not illustrated) assembled to the lower case 3. The electrical connection box 1 is fixed to a battery case that is attached to a vehicle body.

The positive electrode side busbar group 2A and the negative electrode side busbar group 2B are provided with a plurality of busbars 2. The respective busbars 2 are obtained by performing punching and bending process on a conductive sheet metal, and a pair of connection terminals 20 bent upward is formed on both sides thereof. A terminal of an electrical part (relay or fuse) mounted on the lower case 3 or a terminal of a connector is connected to the pair of connection terminals 20.

The lower case 3 is made of an insulating synthetic resin. The lower case 3 is formed in a bottom plate shape by integrally including a bottom wall 4 having a rectangular plate shape, a circumferential wall 5 erected from the periphery of the bottom wall 4, and a partition wall 6 erected from the bottom wall 4 and partitioning the inside of the circumferential wall 5.

Herein, a direction of an arrow Y in FIG. 1 indicates a length direction of the bottom wall 4, a direction of an arrow X in FIG. 1 indicates a width direction of the bottom wall 4, and a direction of an arrow Z in FIG. 1 indicates a standing direction and a height direction of the circumferential wall 5 perpendicular to both the arrow Y and the arrow X.

The bottom wall 4 is provided with a positive electrode side busbar accommodation area 41 in which the positive electrode side busbar group 2A is placed, and a negative electrode side busbar accommodation area 42 in which the negative electrode side busbar group 2B is placed. The positive electrode side busbar accommodation area 41 and the negative electrode side busbar accommodation area 42 are provided along the length direction of the bottom wall 4 (direction of the arrow Y).

Busbar attachment portions 43 for attaching the busbars 2 to the bottom wall 4 are provided in the positive electrode side busbar accommodation area 41 and the negative electrode side busbar accommodation area 42, respectively. The busbar attachment portion 43 protrudes from the bottom wall 4 on both sides of each busbar 2. The busbar attachment portions 43 are provided in parallel to one another, and the busbars 2 are positioned therebetween. A height dimension of the busbar attachment portion 43 is slightly higher than a thickness dimension of the busbar 2 and is lower than a height dimension of the circumferential wall 5 to be described below and the partition wall 6.

The circumferential wall 5 includes a first wall portion 51 and a second wall portion 52, which are provided along the length direction of the bottom wall 4 and face each other, and a third wall portion 53 and a fourth wall portion 54, which are provided along the width direction of the bottom wall 4 and face each other. The third wall portion 53 is provided on the positive electrode side busbar accommodation area 41, and the fourth wall portion is provided on the negative electrode side busbar accommodation area 42. The first wall portion 51 and the second wall portion 52 correspond to "a pair of wall portions" described in claims.

In the circumferential wall 5, the second, third, and fourth wall portions 52, 53, and 54 are formed to have a constant height dimension. In the first wall portion 51, a portion (hereinafter, referred to as a high wall portion 55), of which a height dimension is higher than other wall portions (that is, the second, third, and fourth wall portions 52, 53, and 54), is provided. The high wall portion 55 is a part of the first wall portion 51 provided on the positive electrode side busbar accommodation area 41 side of the partition wall 6 (which will be described below). One end of the high wall portion 55 is provided at a position spaced apart from the third wall portion 53, and the other end thereof is provided continuously to the partition wall 6.

The partition wall 6 is continuously provided over the second wall portion 52 from the first wall portion 51 of the circumferential wall 5 and is provided between the positive electrode side busbar accommodation area 41 and the negative electrode side busbar accommodation area 42 to partition the positive electrode side busbar accommodation area 41 and the negative electrode side busbar accommodation area 42.

The partition wall 6 is configured to include a first partition wall 61 that is continuous to the inner surface of the first wall portion 51 and formed by extending toward the second wall portion 52, a second partition wall 62 that is continuous to the first partition wall 61 and formed by extending in the fourth wall portion 54, a third partition wall 63 that is continuous to the second partition wall 62 and formed by extending toward the second wall portion 52, a fourth partition wall 64 that is continuous to the third partition wall 63 and formed by extending toward the third wall portion 53, and a fifth partition wall 65 that is continuous to the fourth partition wall 64 and formed by extending in the second wall portion 52 and continued to the inner surface of the second wall portion 52. Also, the first partition wall 61 and the fifth partition wall 65 are provided on a straight line with each other, and the first partition wall 61, the fifth partition wall 65, and the third partition wall 63 are provided in parallel. The second partition wall 62 and the fourth partition wall 64 are provided to face each other and are formed to have substantially the same dimension along the length direction of the bottom wall 4.

Also, the second, third, fourth, and fifth partition walls 62, 63, 64, and 65 are formed to have the same height dimension. The first partition wall 61 is formed to have a height dimension slightly lower than the second, third, fourth, and fifth partition walls 62, 63, 64, and 65. The height dimension of the first partition wall 61 is formed to be substantially the same as the height dimension of the high wall portion 55 of the circumferential wall 5.

Furthermore, in the lower case 3, the positive electrode side busbar accommodation area 41, that is, the erected wall 7 erected from the bottom wall 4 in a plate shape, is provided. The erected wall 7 has one end continuous to a boundary between the first wall portion 51 and the high wall portion 55 of the circumferential wall 5, and the other end extending toward the second wall portion 52. The erected wall 7 is formed to have substantially the same height dimension as the highest portion (second, third, fourth, and fifth partition walls 62, 63, 64, and 65) in the partition wall 6.

In the electrical connection box 1, the lower case 3 includes the bottom wall 4, the circumferential wall 5 erected from the bottom wall 4, and the partition wall 6 erected from the bottom wall 4, and the partition wall 6 is the waterproof partition wall 6 partitioning the positive electrode side busbar accommodation area 41 accommodating the positive electrode side busbar group 2A and the negative electrode side busbar accommodation area 42 accommodating the negative electrode side busbar group 2B, which are separately provided. Therefore, water is not penetrated over the positive electrode side busbar accommodation area 41 and the negative electrode side busbar accommodation area 42. It is possible to prevent short-circuiting of the positive electrode side busbar group 2A accommodated in the positive electrode side busbar accommodation area 41 and the negative electrode side busbar group 2B accommodated in the negative electrode side busbar accommodation area 42. Also, the waterproof partition wall 6 is provided, the shape of the lower case 3 can be simplified, and the reduction in the weight of the lower case 3 can be achieved.

In the above-described embodiment, the partition wall is provided from the first partition wall 61 over the second partition wall 62, but may be provided from the third partition wall 63 over the fourth partition wall 64. Also, the positive electrode side busbar accommodation area 41 may be provided in the central portion of the bottom wall 4, and the partition wall 6 may be provided to surround the positive electrode side busbar accommodation area 41. That is, the partition wall 6 may be not continuous to the inner surface of the circumferential wall 5. Also, the partition wall 6 may be provided, for example, between the adjacent wall portions 51 and 52, and both ends thereof may be continuous to the same wall portion 51.

Also, in the above-described embodiment, the electrical connection box 1 is mounted with the positive electrode side busbar group 2A and the negative electrode side busbar group 2B connected to a high voltage battery, but the electrical connection box 1 may be mounted with busbars connected to a low voltage battery, of which a voltage is lower than the high voltage battery. In that case, both the positive electrode side busbar for the low voltage connected to the positive electrode of the low voltage battery and the negative electrode side busbar for the low voltage connected to the negative electrode of the low voltage battery may be accommodated in the negative electrode side busbar accommodation area 42.

Also, the above-described embodiments are merely the representative form of the present invention, and the present invention is not limited to the embodiments. That is, various modifications can be made without departing from the scope of the present invention.

REFERENCE SIGNS LIST

1 electrical connection box
2A positive electrode side busbar (positive electrode side busbar group)
2B negative electrode side busbar (negative electrode side busbar group)
3 case (lower case)
4 bottom wall
5 circumferential wall
6 partition wall
41 positive electrode side busbar accommodation area
42 negative electrode side busbar accommodation area
51 first wall portion (pair of wall portions)
52 second wall portion (pair of wall portions)

The invention claimed is:

1. An electrical connection box comprising:
   a positive electrode side busbar connected to a positive electrode of a high voltage battery;
   a negative electrode side busbar connected to a negative electrode of the high voltage battery; and
   a case in which the positive electrode side busbar and the negative electrode side busbar are accommodated, wherein
   the case includes a bottom wall, a circumferential wall erected from the bottom wall, and a partition wall erected from the bottom wall,
   the circumferential wall is provided with a pair of wall portions facing each other, and the partition wall is provided between the pair of wall portions,
   a positive electrode side busbar accommodation area in which the positive electrode side busbar is accommodated and a negative electrode side busbar accommodation area in which the negative electrode side busbar is accommodated are partitioned over the entire circumference by the partition wall and the circumferential wall, the partition wall is a waterproof partition wall that partitions the positive electrode side busbar accommodation area in which the positive electrode side busbar is accommodated and the negative electrode side busbar accommodation area in which the negative electrode side busbar is accommodated, the case includes a plurality of busbar attachment walls erected from the bottom wall, each of the plurality of busbar attachment walls extends along with a side of the positive electrode side busbar or the negative electrode side busbar, and a height of each of the plurality of the busbar attachment walls is higher than a thickness of the positive electrode side busbar or the negative electrode side busbar, and is lower than a height of each of the circumferential wall and the partition wall.

2. The electrical connection box according to claim 1, wherein an upper end of the partition wall is positioned above an upper end of the circumferential wall.

* * * * *